(12) United States Patent
Lin

(10) Patent No.: US 6,713,194 B2
(45) Date of Patent: Mar. 30, 2004

(54) ORGANIC ELECTROLUMINESCENCE ELEMENT

(75) Inventor: Tung-Shen Lin, Tainan (TW)

(73) Assignee: Lightronik Technology Inc., Tainan (TW)

( * ) Notice: Subject to any disclaimer, the term of this patent is extended or adjusted under 35 U.S.C. 154(b) by 0 days.

(21) Appl. No.: 10/143,997

(22) Filed: May 14, 2002

(65) Prior Publication Data

US 2003/0228487 A1 Dec. 11, 2003

(51) Int. Cl.[7] ................................................ H05B 33/12
(52) U.S. Cl. ........................ 428/690; 428/917; 313/504; 313/506
(58) Field of Search ................................ 428/690, 917; 313/504, 506; 252/301.16

(56) References Cited

U.S. PATENT DOCUMENTS

| | | | |
|---|---|---|---|
| 3,935,031 A | 1/1976 | Adler | 136/206 |
| 4,127,412 A | 11/1978 | Rule et al. | 96/1 PC |
| 4,356,429 A | 10/1982 | Tang | 313/503 |
| 4,769,292 A | 9/1988 | Tang et al. | 428/690 |
| 5,755,999 A | 5/1998 | Shi et al. | 252/301.16 |
| 6,074,734 A | 6/2000 | Kawamura et al. | 428/220 |
| 6,093,864 A | 7/2000 | Tokailin et al. | 585/25 |
| 6,180,267 B1 | 1/2001 | Toguchi et al. | 428/690 |

FOREIGN PATENT DOCUMENTS

| | | |
|---|---|---|
| JP | 2000-299186 | 10/2000 |
| JP | 2001-23777 | 1/2001 |
| JP | 2001-35664 | 2/2001 |
| JP | 2001-118683 | 4/2001 |
| JP | 2001-196181 | 7/2001 |
| JP | 2001-196182 | 7/2001 |

OTHER PUBLICATIONS

C.W. Tang et al. "Organic Electroluminescent Diodes", Appl. Phys. Letter 51, Sep. 1987, pp. 913–915.
C.W. Tang et al. "Electroluminescence of Doped Organic Thin Films", J. Appl. Phys. 65, May 1989, pp. 3610–3616.

*Primary Examiner*—Marie Yamnitzky
(74) *Attorney, Agent, or Firm*—Intellectual Property Solutions, Incorporated

(57) ABSTRACT

An organic EL device which contains an anode, a cathode, and at least one organic thin-film layer including a light emitting layer which contains a compound represented by the following general formula (1):

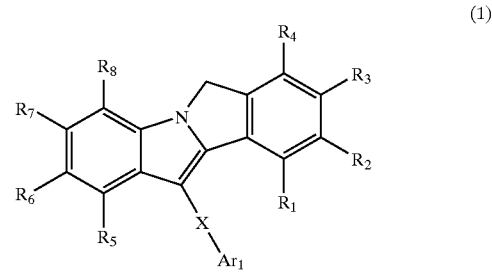

(1)

wherein $Ar_1$ represents a substituted or unsubstituted aromatic hydrocarbon group or a substituted or unsubstituted aromatic heterocyclic group. X represents a single bond or —CH=CH— group. $R_1$ to $R_8$ each independently represents a hydrogen atom, a halogen atom, a nitro group, a cyano group, a substituted or unsubstituted alkyl group, a substituted or unsubstituted amino group, a substituted or unsubstituted alkoxy group, a substituted or unsubstituted aryloxy group, a substituted or unsubstituted alkoxycarbonyl group, a substituted or unsubstituted aromatic hydrocarbon group or a substituted or unsubstituted aromatic heterocyclic group. Any two of $R_1$ to $R_8$ may form a ring.

4 Claims, 5 Drawing Sheets

ORGANIC ELECTROLUMINESCENCE ELEMENT

BACKGROUND OF THE INVENTION FIELD OF THE INVENTION

This invention generally relates to a light emitting device, and more specifically to an organic electroluminescent device of a blue luminescent material having an isoindolo [2,1-a] indole skeleton and good light-emitting properties.

DESCRIPTION OF THE RELATED ART

The organic electroluminescent device (organic EL device) is a light emitting device, containing a fluorescent material which emits light in response to the recombination of hole and electron injected from anode and cathode (C. W. Tang et al. Applied Physics Letters, 51,913 (1987)). Luminescence efficiency can be improved through a method of doping a fluorescent dye. An organic EL device with a coumarin dye as the doping material (Applied Physics Letters, 65,3610 (1989)) can be used to greatly improve the luminescence efficiency. A C-545T (U.S. Pat. No. 4,769,292), which is a well-known coumarin dye, has the following structure:

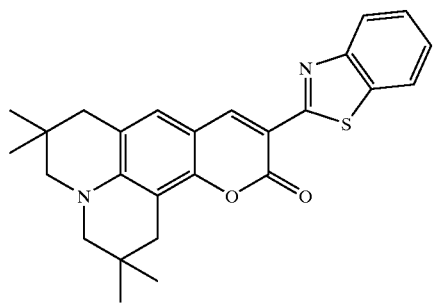

For improving the recombination efficiency of the injected hole and electron, multi-layered devices have been introduced. A hole transporting layer (HTL) containing hole transporting material (HTM) is used to improve the hole injection and transporting from the anode into the organic layer. An NPB (4-4'-bis[N-(1-naphthyl)-N-phenyl-amino-] bisphenyl), which is a well-known HTM, has the following structure:

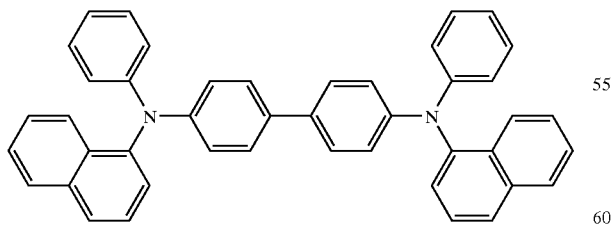

An electron transporting layer (ETL) consisting of an electron transporting material (ETM) is used to improve the electron injection from the cathode into the organic layer. An Alq$_3$ (aluminum tris(8-hydroxyquinolate)), which is a typical ETM, has the following structure:

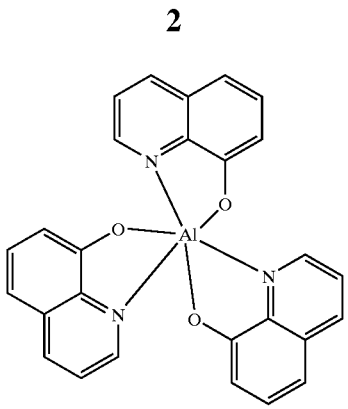

Other materials such as oxadiazole compounds, triazine compounds and triazole compounds also can be used as ETM.

Aromatic dimethylidyne compounds have been used as the blue light emissive material for the organic EL device (U.S. Pat. No. 6,093,864). One example is DPVBi (1,4-bis (2,2-di-phenylvinyl)) biphenyl with an EL peak at about 485 nm, having the following structure:

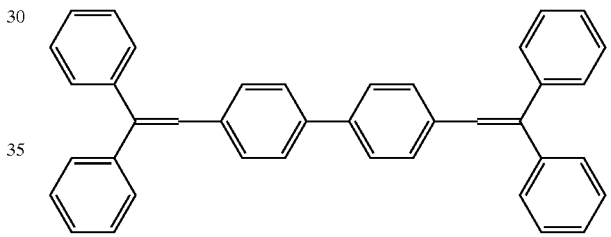

Other blue light emissive materials for organic EL device include:

1,3-Dibenzyldieneindane compound(U.S. Pat. No. 6,180,267), an example of them has the following structure:

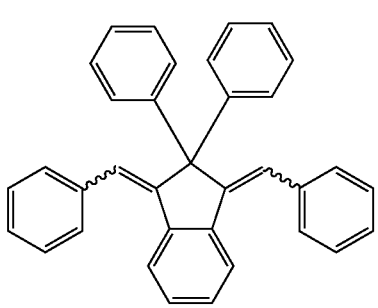

o-(N-aryl-2-benzimidazolyl)phenol organometallic complex (U.S. Pat. No. 5,755,999), an example of them has the following structure:

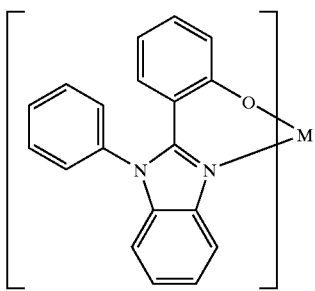

wherein M is a divalent or a trivalent metal.

Heterocyclic compounds (JP-2000-299186, JP-2001-23777, JP-2001-35664, JP-2001-118683, JP-2001-196181, JP-2001-196182), some examples of these compounds are shown with the following structures:

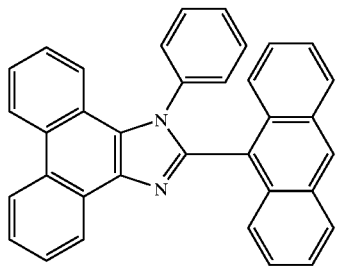

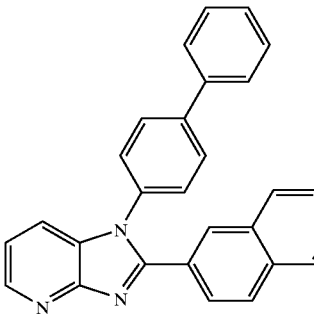

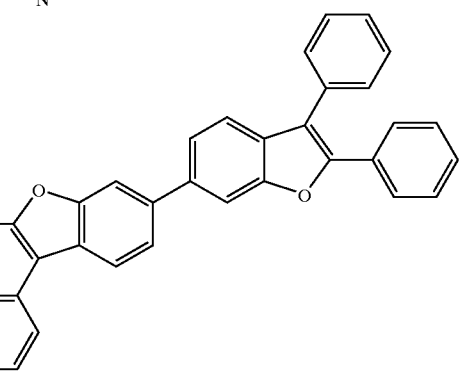

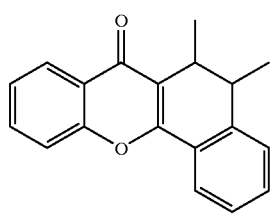

SUMMARY OF THE INVENTION

An object of the present invention is to provide a material having an isoindolo[2,1-a]indole skeleton and to provide an organic EL device having blue luminescence. The organic EL device comprises an anode, cathode, and one or more organic thin film layers which contain, either singly or as a mixture, an indole compound represented by the following general formula (1):

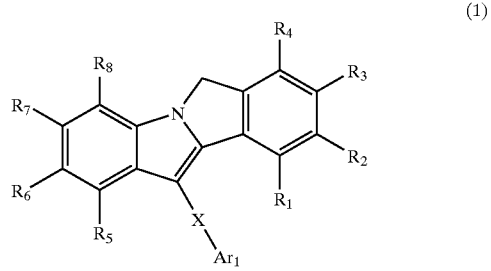

(1)

wherein $Ar_1$ represents a substituted or unsubstituted aromatic hydrocarbon group or a substituted or unsubstituted aromatic heterocyclic group. X represents a single bond or —CH=CH— group. R1 to R8 each independently represents a hydrogen atom, a halogen atom, a nitro group, a cyano group, a substituted or unsubstituted alkyl group, a substituted or unsubstituted amino group, a substituted or unsubstituted alkoxy group, a substituted or unsubstituted aryloxy group, a substituted or unsubstituted alkoxycarbonyl group, a substituted or unsubstituted aromatic hydrocarbon group or a substituted or unsubstituted aromatic heterocyclic group. Any two of R1 to R8 may form a ring.

DETAILED DESCRIPTION OF THE INVENTION

Figure 1:
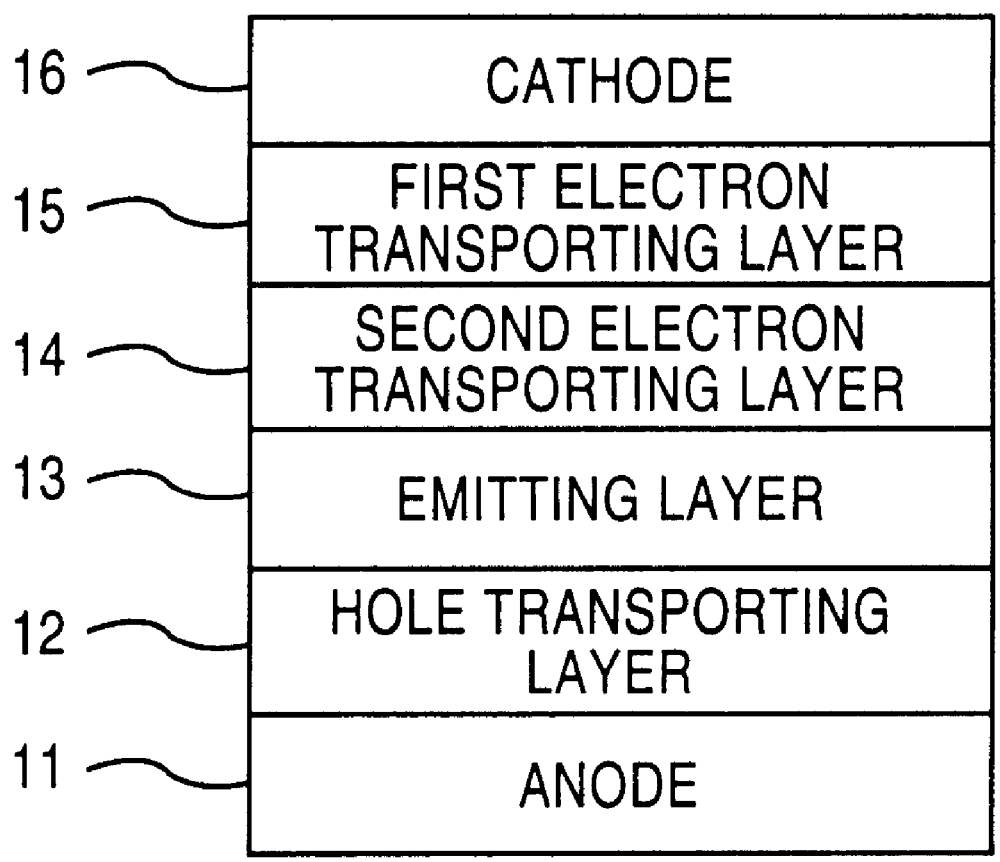
FIG. 1 illustrates a construction of an organic EL element of the present invention.

The present invention will hereinafter be described in detail.

In the present invention, an organic EL element contains light emitting material having isoindolo[2,1-a] indole, represented by the following general formula (1):

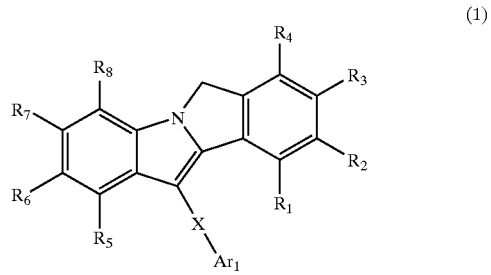

(1)

wherein Ar1, X, R1 to R8 have the same meaning as above.

Referring to the following reaction schemes, synthesis methods to obtain the isoindolo[2,1-a] indole compound represented by the formula (1) of the present invention will be described.

The main skeleton of the isoindolo [2,1-a] indole compound can be formed by the following scheme (1):

(Scheme 1)

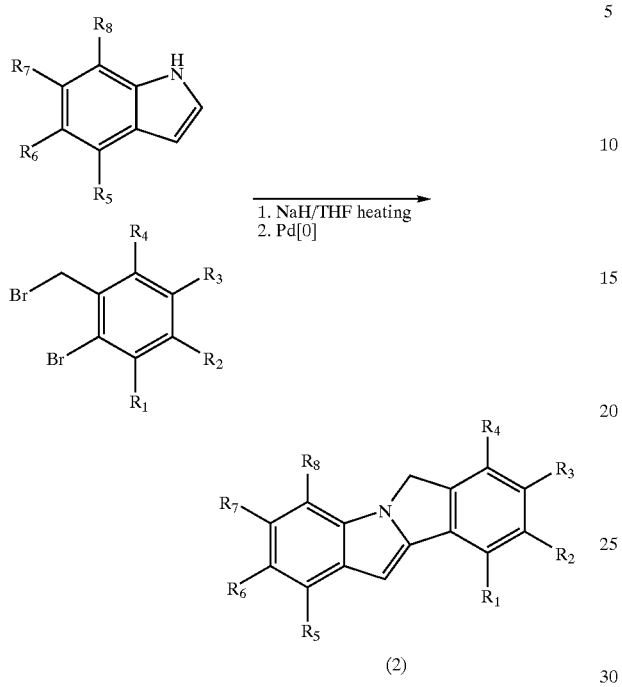

wherein R1 to R8 are the same as defined above.

As shown in the following scheme (2), isoindolo [2,1-a] indole 3-aldehyde compound represented by the formula (3) can be obtained by formylation of isoindolo [2,1-a] indole skeleton compound represented by formula (2), Scheme (2)

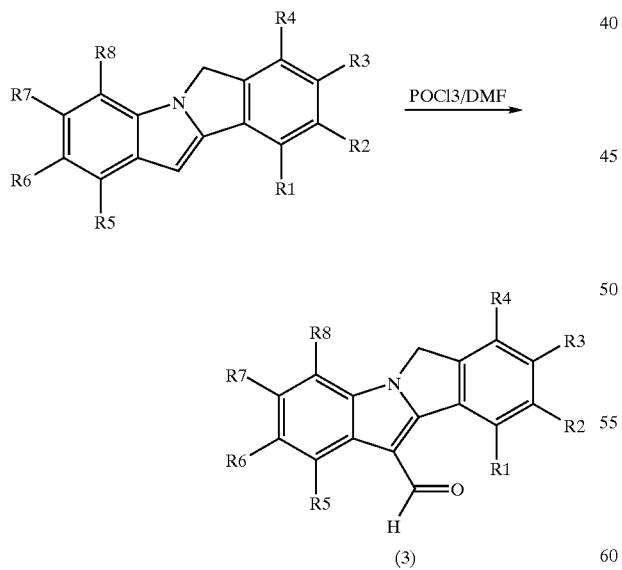

wherein R1 to R8 are the same as defined above.

Isoindolo [2,1-a] indole compound represented by the formula (1) wherein X is a —CH=CH— group can be obtained by reacting with a Witting reagent having the following general formula:

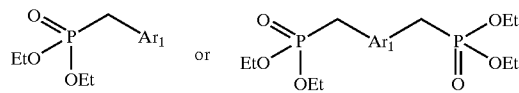

, wherein Ar1 is the same as Ar.

Isoindolo [2,1-a] indole compound represented by the formula (1) wherein X is a single bond can be obtained by reacting with amino aromatic compounds having the following general formula:

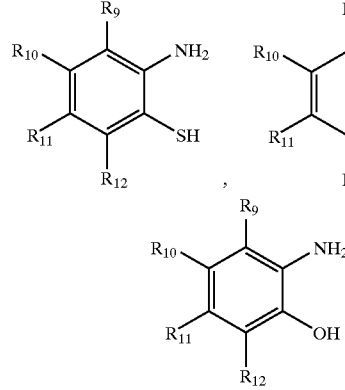

wherein R9 to R12 are the same as defined R1 to R4.

Representative examples of these isoindolo [2,1-a] indole skeleton based compounds are shown below.

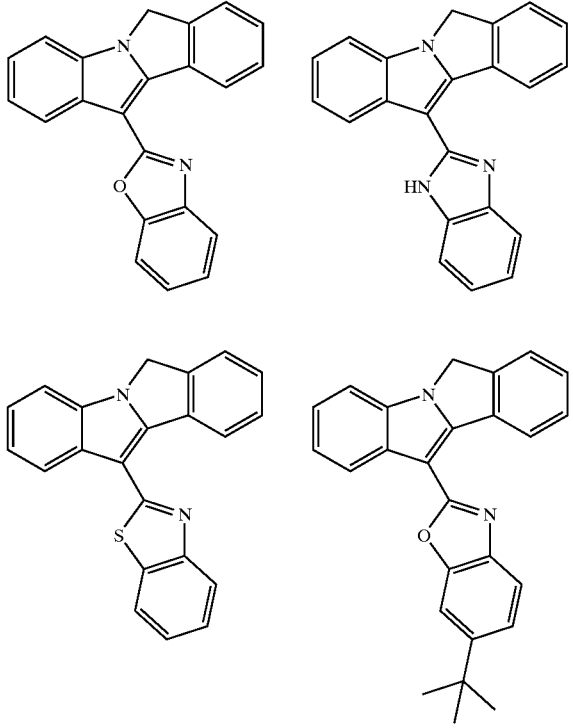

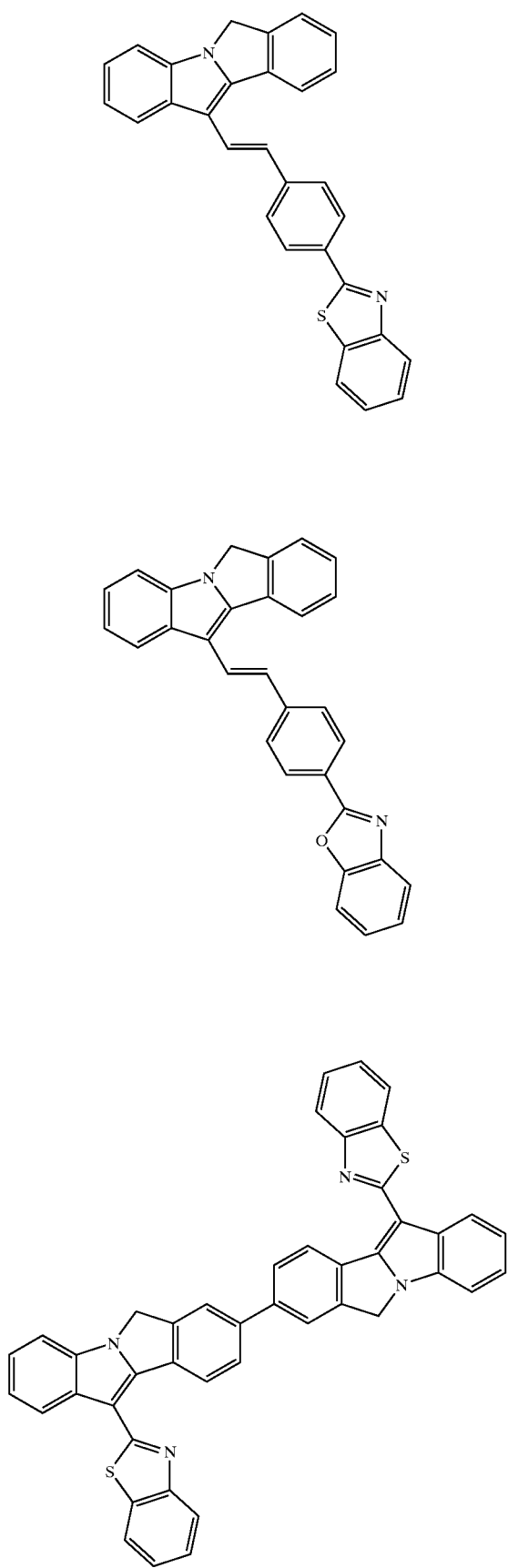
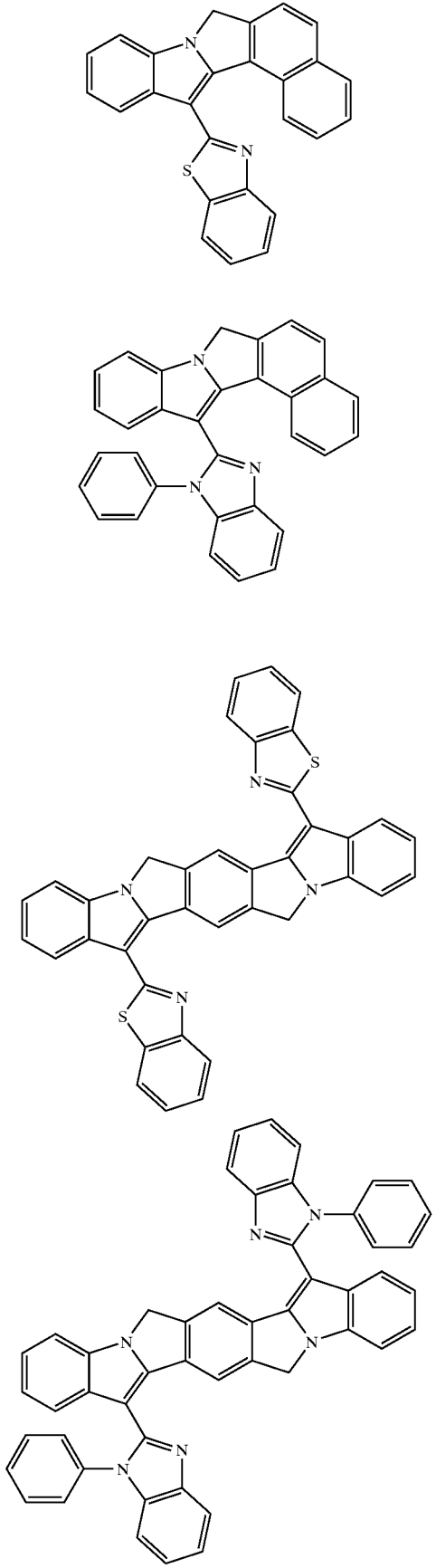

The organic EL device according to the present invention has a multi-layered structure including a light emitting layer, hole transporting layers, and electron transporting layers.

Hole transporting layer contains one or more organic layers including a hole injection layer. A hole injection layer increases the light emitting performance by improving the hole injection from the anode into the organic layers, and improving the contact of anode with organic layers. Typical compounds for the hole injection materials include porphyrin compounds (U.S. Pat. No. 3,935,031 or U.S. Pat. No. 4,356,429) having the example structure:

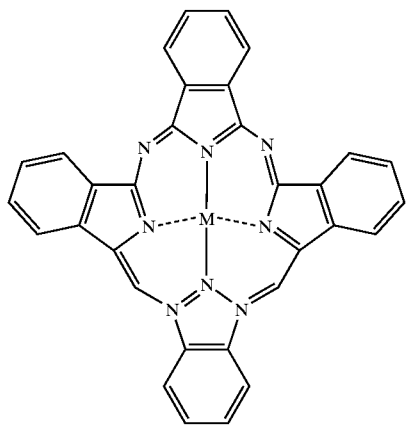

wherein M is a metal, metal oxide, or metal halide.

Aromatic tertiary amine compounds (U.S. Pat. Nos. 4,127,412, 6,047,734) include diarylamine or triarylamine having the example structures:

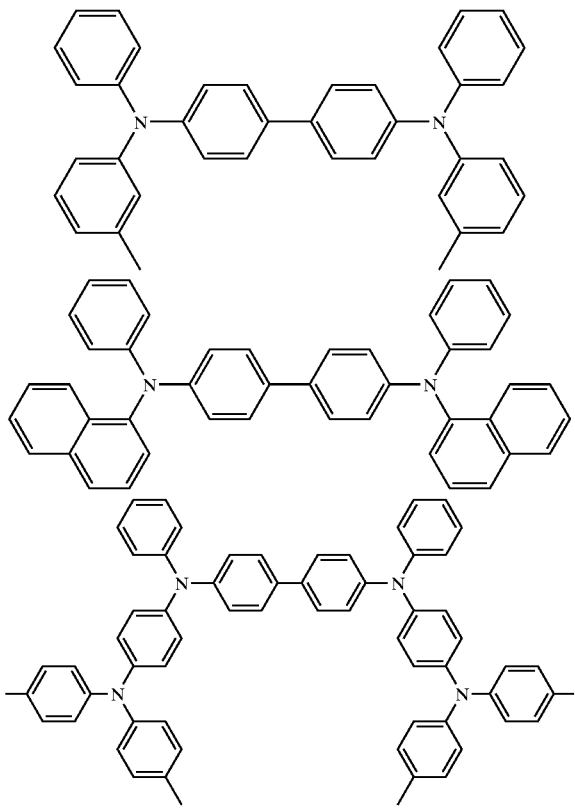

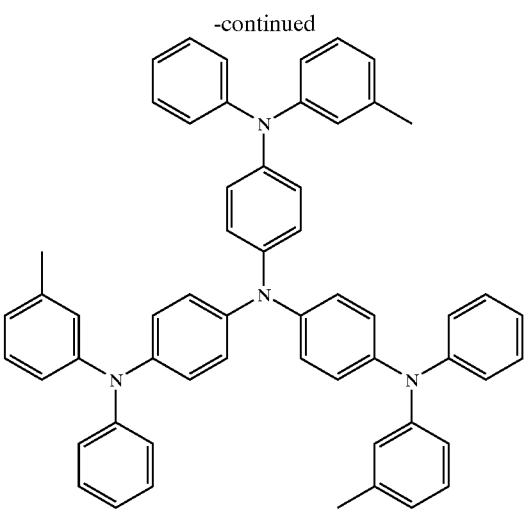

These compounds are suitable for both hole injection materials and hole transporting materials.

Electron transporting layer contains one or more organic layers to inject and transport electron from cathode into organic layer. An electron injection layer increases the light emitting property by improving the electron injection performance from the cathode into the organic layers. Typical compounds for the electron injection materials include oxadiazole compounds, tribune compounds and triazole compounds. Examples of these compounds are shown below:

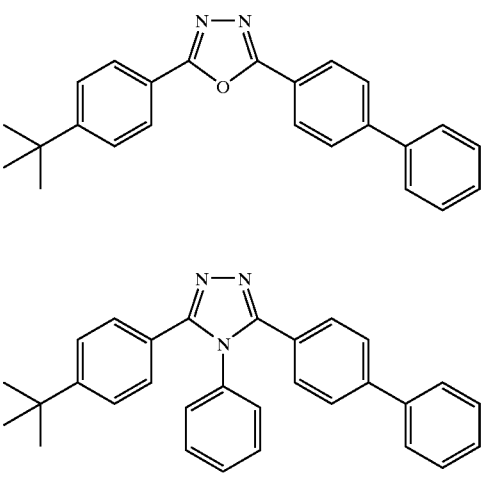

Cathode for an organic EL device can be formed by vacuum deposition of a single metal or two kinds of metal. Typical examples of using single metal as cathode include aluminum (Al), magnesium (Mg), calcium (Ca) and lithium (Li). Common examples of using two kinds of metal as cathode include aluminum-lithium (Al—Li) and magnesium-silver (Mg—Ag). In this present invention, Al is chosen to be a single metal cathode.

Anode for an organic EL device can be formed by coating a conducting material on a substrate. Glass is a common and widely used substrate. In this present invention, conducting material indium-tin-oxide (ITO) on glass substrate is used to be the anode.

In this present invention, an organic EL device is manufactured by vacuum deposition of organic materials and cathode compressed ITO (anode)/organic layers/Al (cathode). Organic layers include hole injection layer, hole transporting layer, emitting layer and electron injection layer. The total thickness of organic layers in this present invention ranges from 5 nm to 500 nm. And the thickness of the cathode is preferably 150 nm to 250 nm. When a DC power of 5 to 25 voltage is applied to the organic EL device in this present invention, blue light emission is obtained.

The present invention will hereafter be described in detail with reference to examples, but the present invention is not limited only to the following examples.

EXAMPLE 1

Synthesis of indole based compound (A) having the structure:

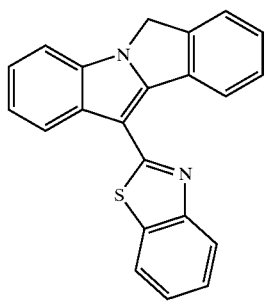

(A)

0.011 mole of indole and 0.011 mole of KOH were stirred homogenous in DMF for 1 hour. 0.01 mole of 2-Bromobenzyl bromide was added into the reaction mixture. The mixture was stirred for 3 hours. Water was added to quench the reaction and extracting with ether. Organic solution was evaporated under reduced pressure and further purification by column chromatography on silica gel with hexane as an eluent gave a pale yellow solid of N-o-bromobenzylbromide indole. (80% yield). 0.01 mole of the indole product, KOAC, DMA, Pd(Ph$_3$P)$_4$ were stirred at 160° C. for 16 hours. After cooling down, the reaction mixture was evaporated under reduced pressure to remove DMA. MeOH was added to get the solid product (A-1). (70%). $^1$H-NMR (CDCl$_3$, TMS) δ (ppm)=5.1 (s, 2H), 6.7 (s, 1H), 7.1–7.8 (m, 8H, aromatic H).

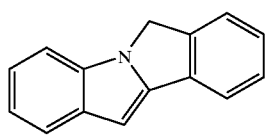

(A-1)

0.01 mole of A-1 was dissolved in DMF (10 ml), and a mixture of POCl$_3$ (0.011 mole) and DMF (0.011 mole) was added drop-wise. After stirring at 75° C. for 1 h, the reaction mixture was added into saturate NaHCO$_3$ solution. The precipitated solid was collected by filtration and washed with ethanol to give a pale gray solid of compound (A-2) (85% yield). $^1$H-NMR (CDCl$_3$, TMS) δ (ppm)=5.1 (s, 2H), 7.1–7.8 (m, 7H, aromatic H), 8.3 (d, 1H, aromatic H), 10.3 (s, 1H, aldehyde H).

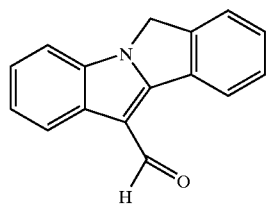

(A-2)

Figure 3:
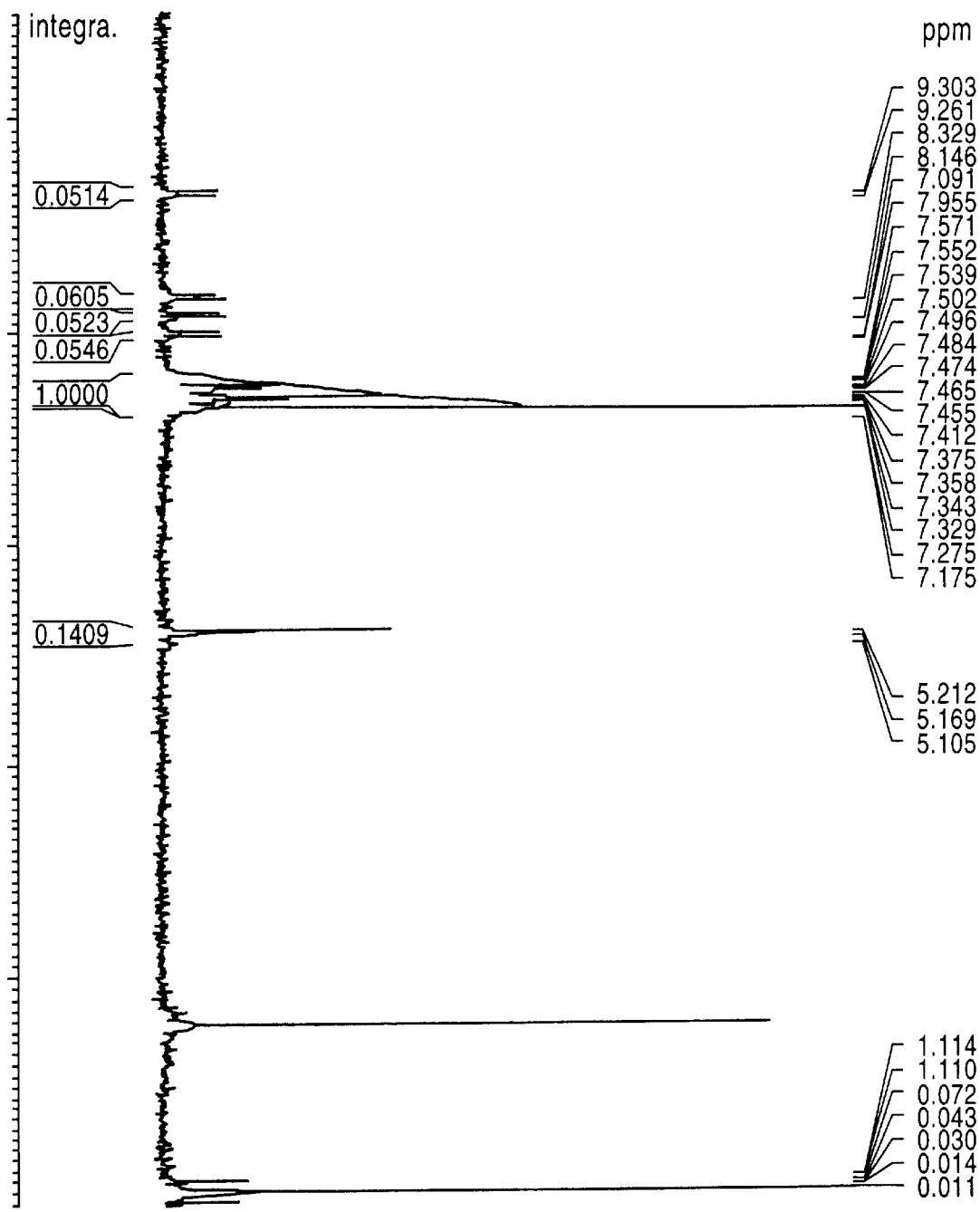
FIG. 3 illustrates the $^1$H-NMR of compound (A)
Figure 4:
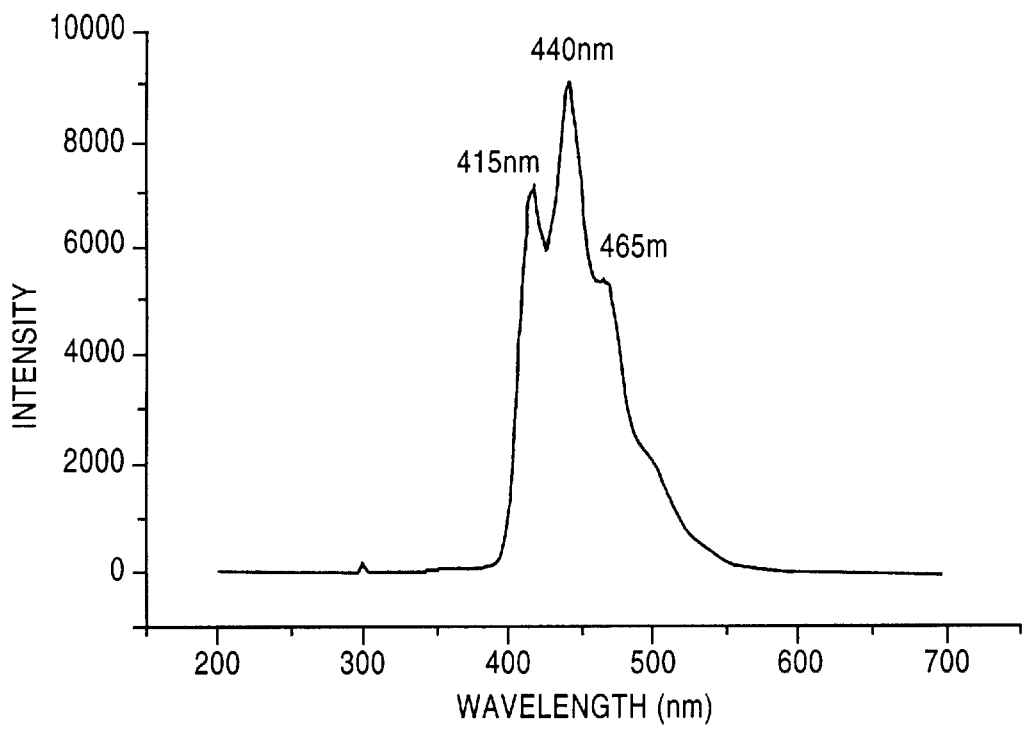
FIG. 4 illustrates the Photoluminescence spectrum of compound (A)

A dry DMF solution of the compound (A-2) (0.01 mole) was added o-aminothiophenol (0.013 mole) and Ac$_2$O (0.5ml) at room temperature. The mixture was stirred at 60° C. for 3 h. The reaction mixture was poured into stirred benzene and the precipitated solid was collected by filtration. The crude solid was washed with MeOH and recrystallized from benzene to afford target compound (A) (32% yield). $^1$H-NMR spectrum is shown in FIG. 3. Photoluminescence spectrum is shown in FIG. 4.

The organic EL device in the example uses the compound (A) as the light emitting material. The example uses the glass substrates with ITO electrode having a surface resistance of 20 (Ω/□) as the anode.

DEVICE EXAMPLE 1-1

As shown in FIG. 1, a 60 nm organic layer 12 is formed on the ITO 11 as the hole-transporting layer by vacuum deposition of NPB having the following structure:

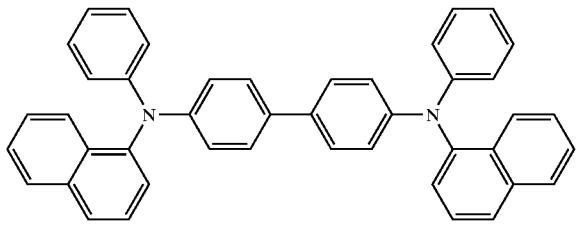

Over the hole-transporting layer 12, a 30 nm emitting layer 13 is formed by vacuum deposition of carbazole biphenyl (CBP) as the host having the following structure:

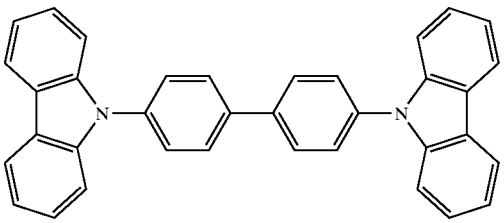

and 2% weight of compound (A) as the dopant on the hole-transporting layer 12. Then, a 20 nm second electron-transporting layer 14 is formed on the emitting layer 13 by vacuum deposition of Alq$_3$ having the following structure:

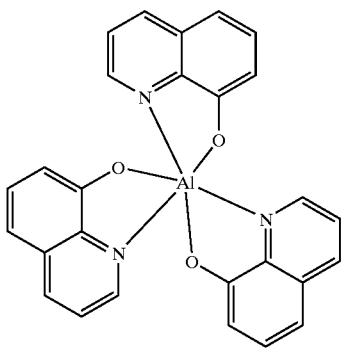

Figure 5:
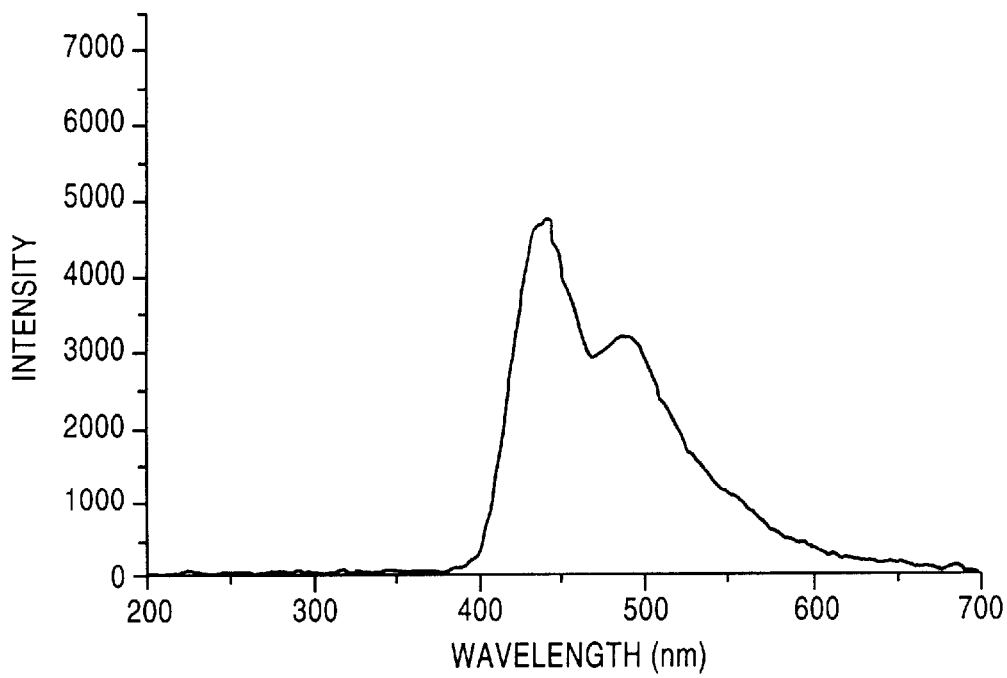
FIG. 5 illustrates the EL spectrum of device example 1.

A 0.7 nm first electron transporting layer 15 is formed on the second electron transporting layer 14 by vacuum deposition of LiF. Finally, a 200 nm aluminum cathode 16 is formed by vacuum deposition on the first electron-transporting layer 15. When a dc voltage of 15 V is applied to the resulting device, a 2700 cd/m² brightness blue light emission is obtained. EL spectrum is shown in FIG. 5.

DEVICE EXAMPLE 1-2

Figure 2:
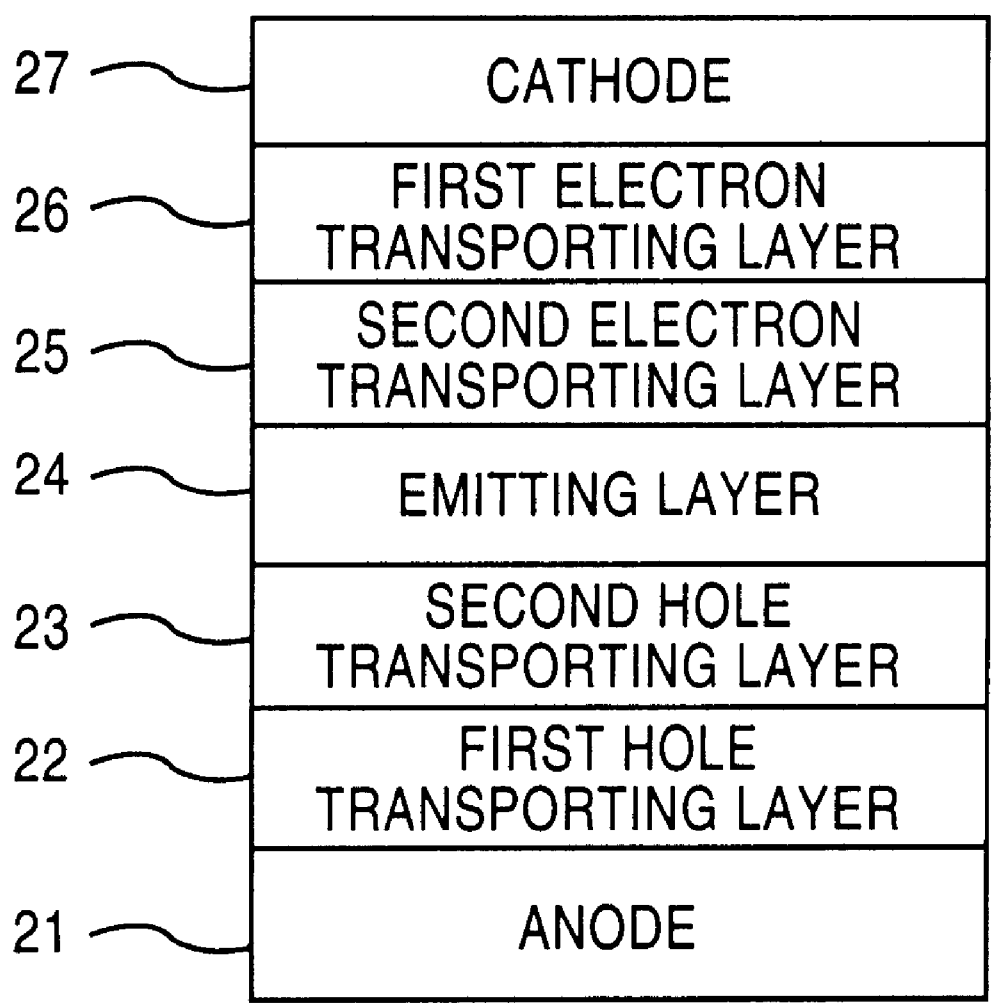
FIG. 2 illustrates another construction of the organic EL element of the present invention.

As shown in FIG. 2, a 30 nm organic layer 22 is formed on the ITO 21 as a first hole transporting layer by vacuum deposition of CuPC having the following structure:

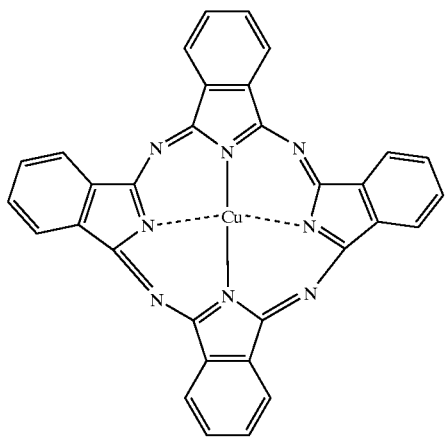

Over the first hole transporting layer 22, a 40nm second hole-transporting layer 23 is formed by vacuum deposition of NPB. Over the second hole-transporting layer 23, a 30 nm emitting layer 24 is formed by vacuum deposition of CBP and 2% weight of compound (A) on the hole-transporting layer 23. Then, a 20 nm second electron-transporting layer 25 is formed by vacuum deposition of Bphen having the following structure:

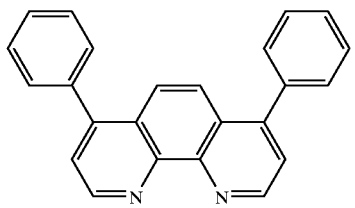

Figure 6:
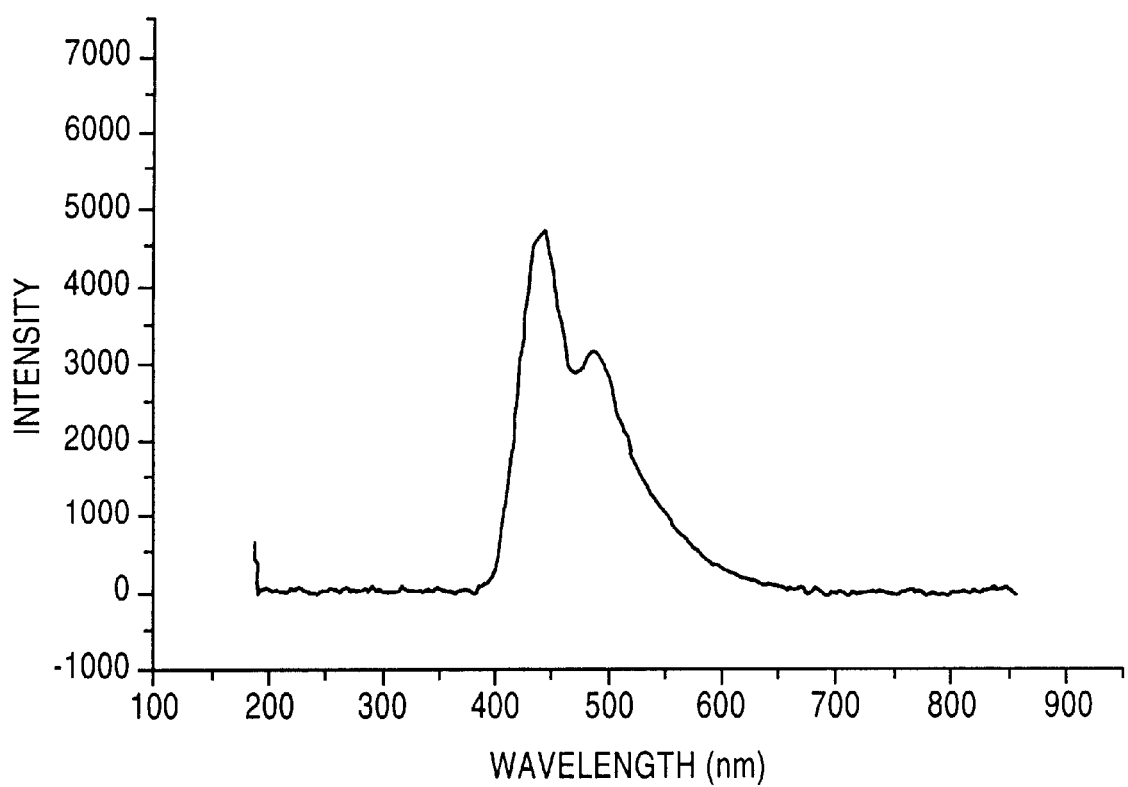
FIG. 6 illustrates the EL spectrum of device example 2.

A 0.7 nm first electron injection layer 26 is form by vacuum deposition of LiF on the second electron transporting layer 25. Finally, a 200 nm aluminum cathode 27 is formed by vacuum deposition on the first electron-transporting layer 26. When a dc voltage of 15 V is applied to the resulting device, a 3800 cd/m² brightness blue light emission is obtained. EL spectrum is shown in FIG. 6. The spectrum is quite the same as the spectrum of example 1.

COMPARED DEVICE EXAMPLE 1-1

In the similar manner as applied to device example 1, an emitting layer is form by vacuum deposition of DPVBi having the structure:

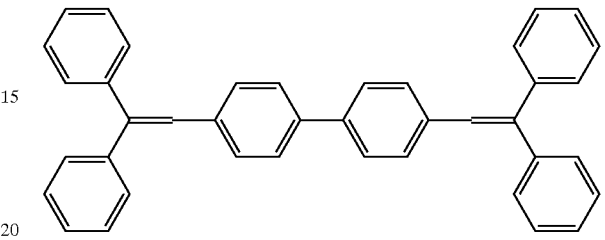

When a dc voltage of 15 V is applied to the resulting device, a 1750 cd/m² brightness blue light emission is obtained.

In comparison with DPVBi as light emitting material, an organic EL device using compound (A) as light emitting material has higher brightness.

What is claimed is:
1. An organic EL device comprising:
   an anode;
   a cathode; and
   one or more organic thin film layers including a light emitting layer adjacent to said anode and said cathode, wherein at least one of the said organic thin film layers contains an isoindolo [2,1-a] indole compound represented by the following formula (1):

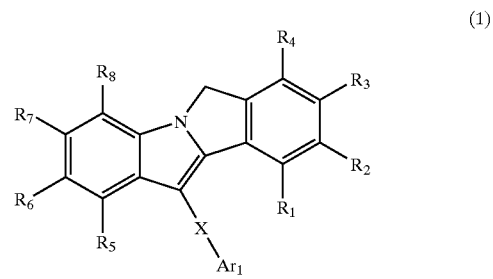

wherein $Ar_1$ represents a substituted or unsubstituted aromatic hydrocarbon group, or a substituted or unsubstituted aromatic heterocyclic group, X represents a single bond or —CH═CH— group, R1 to R8 each independently represents a hydrogen atom, a halogen atom, a nitro group, a cyano group, a substituted or unsubstituted alkyl group, a substituted or unsubstituted amino group, a substituted or unsubstituted alkoxy group, a substituted or unsubstituted aryloxy group, a substituted or unsubstituted alkoxycarbonyl group, a substituted or unsubstituted aromatic hydrocarbon group or a substituted or unsubstituted aromatic heterocyclic group, any two of R1 to R8 may form a ring.

2. An organic EL device comprising:
   an anode;
   a cathode; and one or more organic thin film layers including a light emitting layer adjacent to said anode and said cathode, wherein at least one of the said organic thin film layers contains a compound represented by the following formula (1A):

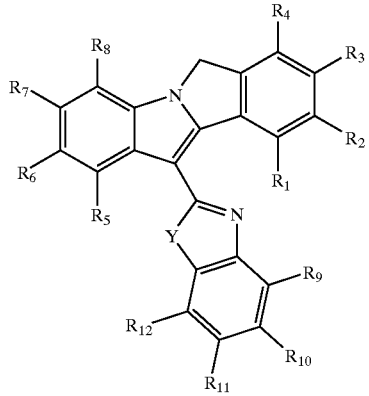

(1A)

and wherein Y represents an oxygen atom, a nitrogen atom bonded to hydrogen or a substituent, or a sulfur atom, R1 to R8 each independently represents a hydrogen atom, a halogen atom, a nitro group, a cyano group, a substituted or unsubstituted alkyl group, a substituted or unsubstituted amino group, a substituted or unsubstituted alkoxy group, a substituted or unsubstituted aryloxy group, a substituted or unsubstituted alkoxycarbonyl group, a substituted or unsubstituted aromatic hydrocarbon group or a substituted or unsubstituted aromatic heterocyclic group; any two of R1 to R8 may form a ring; R9 to R12 have the same meaning with R1 to R4.

3. An organic EL device comprising:
an anode;
a cathode; and
one or more organic thin film layers including a light emitting layer adjacent to said anode and said cathode,
wherein at least one of the said organic thin film layers contains a compound represented by the following formula (1B):

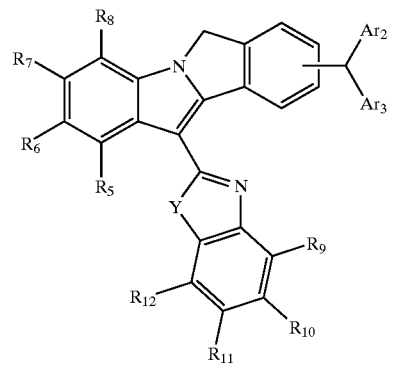

(1B)

and wherein Y represents an oxygen atom, a nitrogen atom bonded to hydrogen or a substituent, or a sulfur atom, R5 to R12 each independently represents a hydrogen atom, a halogen atom, a nitro group, a cyano group, a substituted or unsubstituted alkyl group, a substituted or unsubstituted amino group, a substituted or unsubstituted alkoxy group, a substituted or unsubstituted aryloxy group, a substituted or unsubstituted alkoxycarbonyl group, a substituted or unsubstituted aromatic hydrocarbon group or a substituted or unsubstituted aromatic heterocyclic group; any two of R5 to R8 may form a ring, Ar2 and Ar3 represents a substituted or unsubstituted aromatic hydrocarbon group or a substituted or unsubstituted aromatic heterocyclic group.

4. The organic EL device as set forth in claim 1, claim 2, or claim 3, wherein said organic thin film layers comprise a light emitting layer, at least one hole transporting layer, and at least one electron transporting layer.

* * * * *